United States Patent [19]

Sakamoto

[11] Patent Number: 5,637,910
[45] Date of Patent: Jun. 10, 1997

[54] MULTI-EMITTER OR A MULTI-BASE TRANSISTOR

[75] Inventor: Kazuhisa Sakamoto, Kyoto, Japan

[73] Assignee: Rohm Co., Ltd., Kyoto, Japan

[21] Appl. No.: 382,393

[22] Filed: Feb. 1, 1995

[30] Foreign Application Priority Data

Feb. 2, 1994 [JP] Japan .................................. 6-011209
Feb. 2, 1994 [JP] Japan .................................. 6-011210

[51] Int. Cl.$^6$ .................................................. H01L 27/082
[52] U.S. Cl. ........................ 257/579; 257/584; 257/592
[58] Field of Search ................................ 257/563, 564, 257/578, 579, 592, 593, 584

[56] References Cited

U.S. PATENT DOCUMENTS

| | | | |
|---|---|---|---|
| 5,221,856 | 6/1993 | Dekker et al. | 257/592 |
| 5,386,140 | 1/1995 | Matthews | 257/592 |

FOREIGN PATENT DOCUMENTS

| | | | |
|---|---|---|---|
| 0071 915 A3 | 7/1982 | European Pat. Off. . | |
| 0 341 221 A3 | 11/1989 | European Pat. Off. . | |
| 2 543 736 | 10/1984 | France . | |
| 53-36481 | 4/1978 | Japan | 257/579 |
| 60-160165 | 8/1985 | Japan . | |
| 1-93167 | 4/1989 | Japan . | |
| 1-232742 | 9/1989 | Japan | 257/563 |
| 6-37098 | 2/1994 | Japan | 257/579 |
| 93/08599 | 4/1993 | WIPO | 257/592 |

OTHER PUBLICATIONS

Transistor Technique, Jan. 1993.
"Multiepitaxial–Planar–Leistungstransistoren," 2087 Elektronik, vol. 30, (1981.03), No. 5, Munchen BRD.

*Primary Examiner*—Mahshid D. Saadat
*Assistant Examiner*—Courtney A. Bowers
*Attorney, Agent, or Firm*—Nikaido Marmelstein Murray & Oram LLP

[57] ABSTRACT

A transistor includes (a) a first semiconductor layer formed by a semiconductor substrate; (b) a second semiconductor layer formed on the first semiconductor layer and having an impurity of the same conductivity type as the first layer in a concentration lower than that of the first semiconductor layer; and (c) a third semiconductor layer formed on the second semiconductor layer having an impurity of the same conductivity type as the first semiconductor layer in a concentration lower than that of the second semiconductor layer. A base region is formed in the third layer and an emitter region is formed in the base region.

10 Claims, 10 Drawing Sheets

MULTI-EMITTER OR A MULTI-BASE TRANSISTOR

BACKGROUND OF THE INVENTION

The present invention relates to a power transistor of high breakdown voltage in, for example, multi-emitter or multi-base structure. More particularly, it relates to a power transistor capable of switching at high speed.

Hitherto, in the power bipolar transistor for switching power source for handling a large electric power, higher breakdown voltage, larger current, faster switching, and wide safe operating area (SOA) are being demanded. Accordingly, it has been generally attempted to heighten the resistance by increasing the specific resistance or thickness of the collector layer. For higher breakdown voltage, moreover, it is known effective to increase the thickness of the base region because the electric field concentration can be alleviated in the curvature part of pn junction.

Moreover, as shown in FIG. 8, it is also known to enhance the breakdown voltage by using a diffusion wafer of high resistance, or using field limiting ring (FLR) 44 or field plate (FP) 45. More specifically, in the planar transistor of high breakdown voltage, theoretical breakdown voltage is not obtained because of impurities such as electric charge at the interface of the surface of semiconductor layer and insulating film such as electric charge at the interface of the surface of semiconductor layer and insulating film such as oxide film. For that reason, a wafer of higher specific resistance than theoretical value is used, and a field limiting ring 44 is provided to expand the depletion layer of the base-collector junction to the outer periphery of the collector region to enhance the breakdown voltage (for example, see the Japanese Unexamined Patent Publication No. 135158/1986), or the negative bias side electrode is extended to cover the surface of pn junction to compensate the positive electric charge in the oxide film of the planar junction by electric field, and a field plate 45 with a stable surface state is provided, thereby enhancing the breakdown voltage.

This conventional transistor comprises a collector region 41 made of a semiconductor layer 41b of n⁻ type low impurity concentration formed by epitaxial growth on a semiconductor substrate 41a of n⁺ type, a p type base region 42 formed in the collector region 41 by diffusion or the like, an n⁺ type emitter region 43 formed in the base 42 by diffusion or the like, and a field limiting ring 44 of p type, the same conductive type as the base, is provided outside the base-collector junction so as to surround the base-collector junction. A field plate 45 is formed as the end portion of the base electrode is provided over the pn junction. Reference numeral 46 is an annular region of an element boundary.

The constitution is the same in the multi-type transistor of multi-emitter or multi-base structure. The operating current of the transistor requiring a large output, that is, the collector current of the absolute maximum rating is mainly related with the area and peripheral length of the emitter, and to increase this operating current, it is needed to increase the emitter area and peripheral length so as to lower the current density. Hence, a transistor of multi-emitter or multi-base structure is considered.

To maintain a high frequency characteristic, moreover, it is necessary to decrease the thickness of the base region so as to decrease the junction capacity and of the base region shorten the time $\tau_b$ for the carrier to run through the base region. On the other hand, to enhance the breakdown voltage, it is necessary to increase the thickness of the base region as mentioned above. However, when the thickness of the base region is increased, the high frequency characteristic is imparied, and the switching speed in the proportional relation becomes slow. Hence, to maintain high frequency characteristic and high breakdown voltage, for example, a transistor of comb-shaped emitter structure as shown in FIG. 9 is proposed by Tsutomu Nozaki in "Searching the latest trend of transistor" (Transistor Technology published by CQ Publishing Co., January 1993, pp. 300–301).

In the transistor of comb-shaped emitter structure shown in FIG. 9, for example, on a collector region 56 of n conductive type, a base region 54 of p conductive type, an emitter region 57a of n conductive type, and an insulating film 58 are formed, and multiple comb-shaped emitter regions 57 a are formed in the base region 54, and it is composed so that the base region 54 of the bottom side of the emitter region 57a may be thinner. Openings are provided in insulating films 58 on the emitter region 57 and base region 54, and an emitter contact 52 and a base contact 53 are formed, and the emitter electrode wiring 51 and base electrode wiring 55 by coupling them are respectively connected to the emitter pad 49 and base pad 50. As a result, the emitter region 57a is formed in a thin comb shape, and the base region 54 beneath the emitter region 57a is thin, and hence the high frequency characteristic is improved, and the surrounding base region is formed thick, so that a higher breakdown voltage is achieved.

On the other hand, in order to shorten the storage time which is important as switching-off characteristic (the time returning to the active region by releasing excess carrier from the saturated state accumulating excess carrier in the base and collector region), for example, as shown in lines 2 to 7 of lower left column of page 2 and FIGS. 1 and 2 of the Japanese Unexamined Patent Publication No. 160165/1986, a bipolar transistor capable of controlling the storage time efficiently is proposed. This bipolar transistor is formed by connecting an internal base layer 64 stradding over the collector layer 62 and collector epitaxial layer 63 on the semiconductor substrate 61 to the base layer 65. In such bipolar transistor incorporating the internal base layer 64, the carrier injected from the emitter 66 easily recombined in the internal base layer 64, and the carrier life time can be shortened. While, paying attention to the carrier injected in the collector side, when changing over the transistor from ON state to OFF state, the carrier is absorbed by the inverse base current flowing through the internal base layer 64 of low resistance, and is recombined. In this transistor, since the carrier is absorbed through the internal base layer 64 of low resistance, the storage time can be shorter than in the prior art.

In the transistor provided with field limiting ring and field plate in order to heighten the breakdown voltage of transistor, they are ususally provided outside the base region, and the number of field limiting rings must be increased in order to have a sufficient breakdown voltage, which requires a wider collector area, resulting in a large chip size.

While, in the transistor enhanced in breakdown voltage by forming the collector region in a high resistance layer, the saturation voltage between collector and emitter $V_{CE}$(sat) is high, and the effective emitter area must be widened, and hence the chip size becomes large, and the base region must be made thick in order to heighten the breakdown voltage, and hence a longer diffusion time is needed, and the cost is increased.

In the transistor as shown in FIG. 9, on the other hand, the base region is shallow, and a certain high frequency characteristic may be maintained and a high breakdown voltage can be realized, but the minority carrier which is the factor of impeding the high speed switching action of transistor cannot be extracted, and hence the time of the switching is slow.

Further, in the bipolar transistor as shown in FIG. 10, since the minority carrier can be extracted, a high speed switching action can be realized, but since the base region is shallow, the safe operating area (SOA) is narrow, and enhancement of breakdown voltage is insufficient.

SUMMARY OF THE INVENTION

It is hence a primary object of the invention to solve these problems and present a transistor with low saturation voltage, high breakdown voltage, and high speed switching characteristic.

It is other object of the invention to present a transistor, in order to solve the problems, capable of maintaining high frequency characteristic, in particular, wide in safe operating area (SOA) at high breakdown voltage, and capable of obtaining high speed switching action, high current amplification factor, and high transition frequency $f_T$.

To achieve the first object, the present inventor intensively investigated into the relationship of the impurity concentration of each layer and layer thickness to enhance the breakdown voltage and decrease the saturation voltage $V_{CE}$ (sat), and discovered that the breakdown voltage is enhanced by dividing the collector region into two layers differing in the impurity concentration, and forming the layer of lower impurity concentration at the surface side of semiconductor layer, and that the transistor characteristic can be enhanced, that is, the saturation voltage $V_{CE}$(sat) is lowered and the switching speed is increased, by defining the impurity concentration in the operating area at an ordinary theoretical concentration.

The breakdown voltage BV of the transistor is generally expressed as follows:

There are supposed the impurity concentration of bulk (collector layer) to be $N_C$, the radius of curvature to be $r_j$, the constant determined by the junction state to be n (this value of n is 1 in a cylindrical junction, 2 in a spherical junction, and ∞ in a planar junction), and the thickness of base region to be $W_B$.

$$BV \simeq \left(\frac{N_C}{10^{16}}\right)^{-3/4} [\{(n+1+r)r^n\}^{1/(n+1)} - r] \quad (1)$$

Where $$r \simeq \frac{r_j}{W_B}$$

and this breakdown voltage BV is larger when the impurity concentration $N_C$ of the collector layer is smaller and the thickness $W_B$ of the base region is larger.

On the other hand, the saturation voltage $V_{CE}$(sat) of the transistor is expressed as follows, supposing the specific resistance of the collector layer to be $r_C$, the thickness of collector layer to be $W_C$, the effective emitter area to be $A_E$, and the collector current to be $1_C$.

$$V_{CE}(sat) \propto \rho_C \frac{W_C}{A_E} \cdot I_C$$

and $V_{CE}$(sat) is lower as the collector layer specific resistance $r_C$ and thickness $W_C$ are smaller, and the impurity concentration of collector layer is in the trade-off relation with the condition for enhancing the breakdown voltage. Hence, in the invention, the collector layer is divided into two layers, and the both functions are achieved.

The transistor of the invention comprises:

(a) a first semiconductor layer formed by a semiconductor substrate;

(b) a second semiconductor layer formed on the first semiconductor layer and having an impurity of the same conductivity type as said first layer in a concentration lower than that of the first semiconductor layer; and (c) a third semiconductor layer formed on the second semiconductor layer having an impurity of the same conductivity type as said first semiconductor layer in a concentration lower than that of the second semiconductor layer;

wherein a base region is formed in the third layer and an emitter region is in the base region.

It is preferred that the semiconductor substrate because a wider safe operating area is obtained.

According to the transistor of the invention, on the surface of the second semiconductor layer of low impurity concentration provided on a semiconductor substrate, the third semiconductor layer of the same conductive type is formed a much lower impurity concentration. So, the portion likely to break down of the semiconductor layer surface is high in resistance, contribute to enhancement of breakdown voltage, and the semiconductor layer contributing to operation of the transistor inside is formed at an impurity concentration suited to usual transistor operation, and therefore a transistor of high speed switching action is realized at a low saturation voltage.

The transistor in the second aspect of the invention is a transistor comprising a collector region of first conductive type provided on a semiconductor substrate, a base region of second conductive type provided on the collector region, and an emitter region of the first conductive type provided on the base region, with emitter regions or base regions formed in a plurality of insular forms, in a multi-emitter or multi-base structure comprising of a plurality of unit transistors, wherein each unit transistor is formed so that the thickness of the base region immediately beneath the emitter region may the be thinner than the thickness of the base region in the portion free of the emitter region, and hence and the base region is formed in a "π"-like shaped section, and the internal base layer is formed in each recess of "π"-like shaped. Herein, the first conductively type and second conductive type are the first conductive type of either conductive type of n type or p type and the second conductive type of the other p type or n type.

The "π"-like shaped section of the base region is formed in at least two adjacent unit transistors continuously, and the internal base layers are formed in the recess of the base region of the adjacent unit transistors, and hence it is preferred because the patterning is easy, the internal of unit transistors can be narrowed, and the chip size can be reduced.

Moreover, when each internal base layer of the unit transistor is connected with the base region of the unit transistor, it is preferred because the element is further reduced in size.

Besides, the internal base layer is connected to the high concentration impurity region introduced from the surface of the semiconductor substrate, and is connected to the base electrode by wiring, and hence it is connected to the base electrode through the low resistance region of high impurity concentration to the base electrode through the low resistance region of high impurity concentration without passing through the base region of high resistance, so that the carrier is the semiconductor of quick, which is preferred for switching operation at high speed.

According to the transistor in multi-emitter or multi-base structure of the invention, the base region immediately beneath the emitter region of each unit transistor is formed thinly, and an internal base layer is provided beneath it, so that the current amplification factor $h_{FE}$ and transition frequency $f_T$ depending on the thickness of the base region can be increased, while the residual carrier in the collector region can be absorbed in a short time by the internal base layer, so that the switching action becomes faster in speed.

The base region at both sides immediately beneath the emitter region of each unit transistor is formed thick, and therefore the safe operating area is wide, and the breakdown voltage is enhanced.

DETAILED DESCRIPTION

EXAMPLE 1

Figure 1:
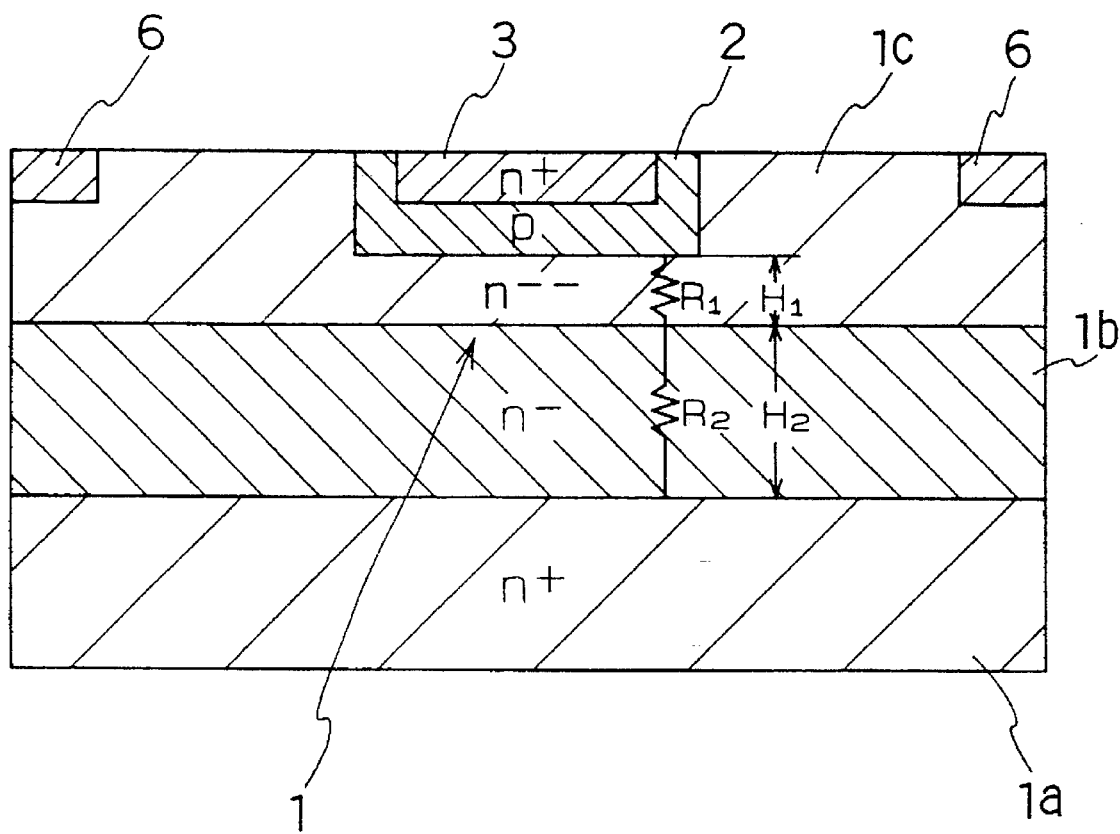
FIG. 1 is a partial sectional explanatory diagram showing example 1 of transistor of the invention.

Referring now to the drawings, a transistor according to a first aspect of the invention is described in detailed below.

As shown in FIG. 1, the transistor of the first aspect of the invention comprises a collector region 1 comprising a second semiconductor layer 1b of n⁻ type of low impurity concentration formed on a first semiconductor layer 1a which is a semiconductor substrate of, for example, n⁺ type, and a third semiconductor layer 1c of same conductive type n⁻ type of further lower impurity concentration than in the second semiconductor layer 1b epitaxially grown on the second semiconductor layer 1b, a base region 2 of, for example, p type formed by diffusion or the like on the third semiconductor layer 1c of the collector region 1, and an emitter region 3, for example, n⁺ type formed by diffusion or the like on the base region 2.

The second semiconductor layer 1b is provided on the semiconductor substrate by diffusion or epitaxial growth, and is the principal portion of the collector region 1 of the transistor, and its specific resistance is formed around $1\times10^0$ to $1\times10^3$ $\Omega$.cm (impurity concentration $5\times10^{12}$ to $5\times10^{15}$/cm³). The third semiconductor 1c is formed on the second semiconductor layer 1b by means of epitaxial growth. The third semiconductor layer 1c is intended to enhance the breakdown voltage on the semiconductor layer surface, and is formed in a thickness of about several to scores of micrometers at a specific resistance of $1\times10^1$ to $1\times10^4$ $\Omega$.cm (impurity concentration $5\times10^{11}$ to $5\times10^{14}$/cm³).

Figure 2:
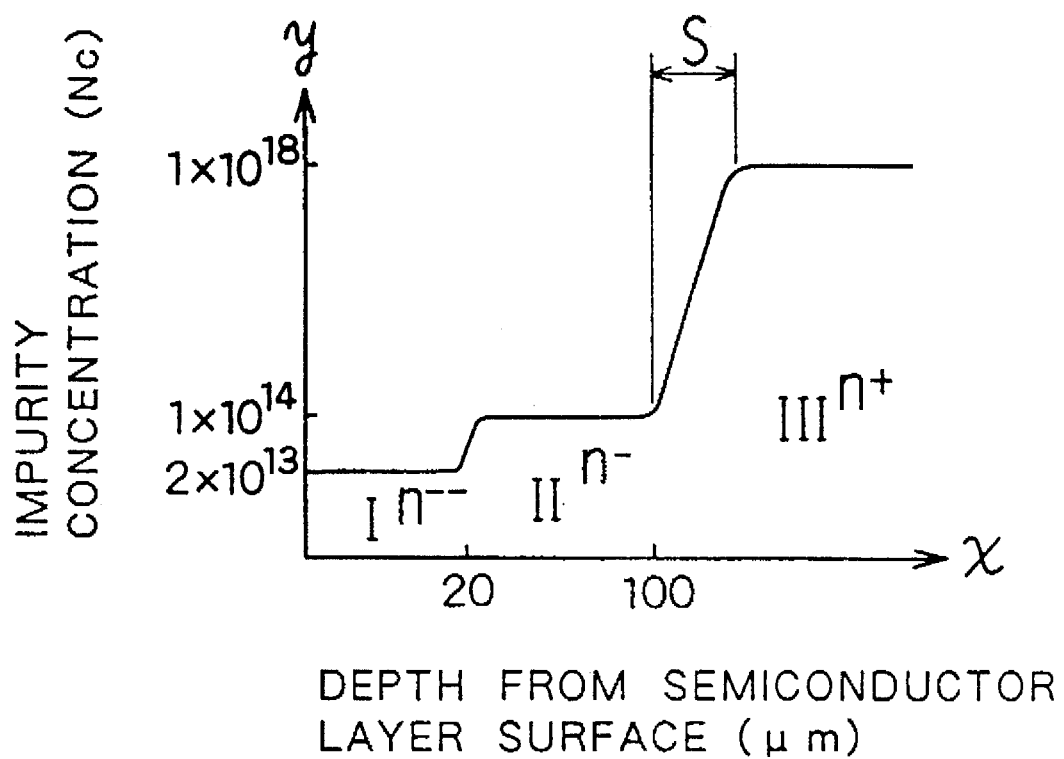
FIG. 2 is a diagram showing an impurity concentration of each layer of collector region of the transistor of example 1.

The relation between the depth and impurity concentration of each semiconductor layer is shown, for exmple, in FIG. 2, in which the depth from the surface of the semiconductor layer is plotted on the x-axis and the impurity concentration Nc on the y-axis. In FIG. 2, the third semiconductor layer 1c, second semiconductor layer 1b, first semiconductor layer 1a are respectively indicated by I, II and III.

That is, in the transistor of this example, the saturation voltage of the transistor $V_{CE}$(sat) is set low, and on the second semiconductor layer 1b of low impruity concentration, being such an impurity concentration as to obtain a high speed switching, the third semiconductcor layer 1c of the same conductive type is formed at a further lower impurity concentration than that of the second semiconductor layer 1b is provided by epitaxial growth, thereby forming the collector region 1. Hence, the resistance portion of the collector region 1 is the sum $R_1+R_2$ of resistance $R_1$ of the third semiconductor layer 1c between the bottom of the base region 2 and the second semiconductor layer 1b and resistance $R_2$ of the second semiconductor layer 1b. The specific resistance of the third semiconductor layer 1c is about 2 to 10 times as large as that of the second semiconductor layer 1b, but the thickness $H_1$ is thin between the bottom of the base region 2 and the second semiconductor layer 1b, being about 1/10 of thickness of thickness $H_2$ of the second semiconductor layer 1b, and the resistance $R_1$ is smaller than the resistance $R_2$, and hence the resistance of the collector region 1 is nearly determined by $R_2$. Further, the base region 2 may be diffused up to the second semiconductor layer. In this case, the resistance $R_1$ is eliminated.

As a result, be setting the specific resistance of the second semiconductor layer 1b so as to be a theoretical value, a transistor of fast switching speed is obtained at a low saturation voltage. On the other hand, concerning the breakdown voltage, although breakdown is likely to occur on the surface of the semiconductor layer which is susceptible to the effect of electric charge, this portion is formed of the third semiconductor layer 1c which is low in the impurity concentration and high in specific resistance, it is resistant to breakdown as known from formula (1), and a transistor of high breakdown voltage is obtained on the whole. The impurity concentration of the third semiconductor layer of 1c resistant to breakdown and not adversely affecting the transistor characteristic is about $5\times10^{11}$ to $5\times10^{14}$/cm³ (specific resistance $1\times10^1$ to $1\times10^4$ $\Omega$.cm). If the impurity concentration it too low, the resistance $R_1$ is too large for the collector region 1 beneath the base region 2 and the saturation voltage $V_{CE}$(sat) is too large, and the switching speed drops, or if the impurity concentration is too high, it is less resistant to breakdown, and high breakdown voltage is not obtained.

Meanwhile, since a high breakdown voltage is obtained by the high resistnace of the third semiconductor layer 1c, the depletion layer for breakdown voltage may be thin, and the third semiconductor layer 1c is formed in a thickness of about 10 to 50 μm, and the base region 2, in thickness of about 5 to 100 µm. For the sake of breakdown voltage, the thickness of the base region 2 is desired to be greater, but if the thickness of the base region 2 is reduced to such thinness, a sufficient breakdown voltage is assured, since the breakdown voltage is increased by lowering the impurity concentration. As a result, the base region 2 is thin and the diffusion time for forming the base region is cut short, so that the cost may be reduced.

The semiconductor substrate comprising the second semiconductor layer 1b may be either a diffusion semiconductor substrate using, for example, an n⁻ type semiconductor substrate of low impurity concentration as second semiconductor substrate 1b, and introducing an n type impurity further on the back side to form an n⁺ type first semiconductor layer 1a, or an epitaxial growth substrate having an n⁻ type second semiconductor layer 1b epitaxially grown on the surface of the semiconductor substrate made of an n⁺ type first semiconductor layer. The diffusion semiconductor substrate is modest in the boundary of impurity concentration (see S in FIG. 2) between the second semiconductor layer 1b and first semiconductor layer 1a, and is resistant to short pulses and broad in safe operating area, which is very preferable. The epitaxial growth substrate is steep in the boundary of impurity concentration.

According to the invention, a high breakdown voltage is achieved by disposing a semiconductor layer of high resistance of semiconductor layer, but it can be also used together with the field limiting ring or field plate employed hitherto. In the element dividing area around the transistor, and annular region 6 is provided same as in the prior art.

Figure 3A:
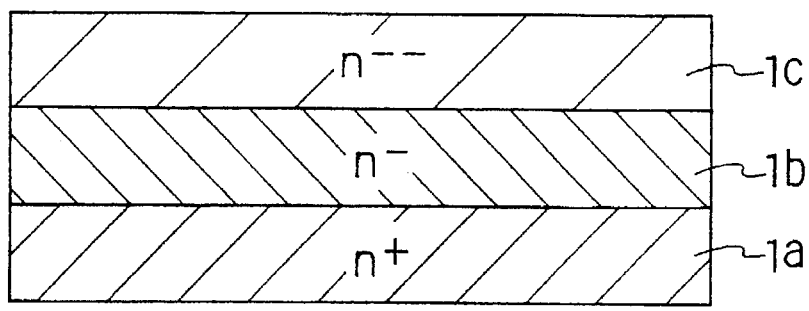
FIGS. 3(a) through 3(c) illustrate sectional explanatory diagrams showing an example of fabrication method of the transistor of example 1.
Figure 3B:
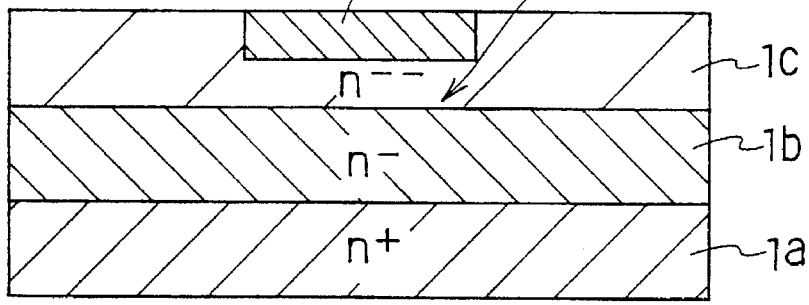
Figure 3C:
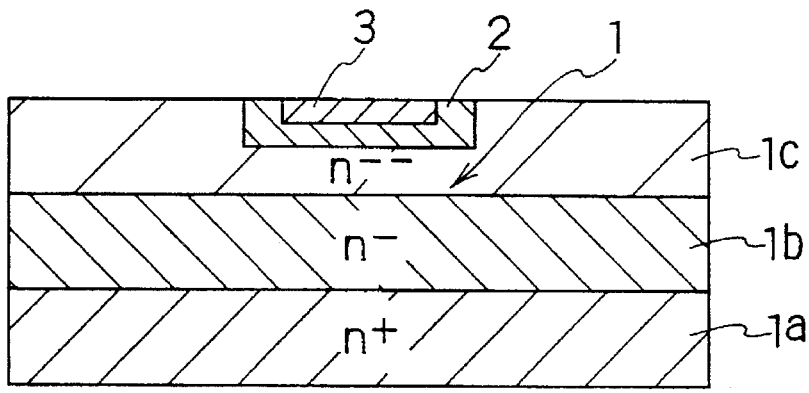

The fabrication method of the transistor of this example is described according to the process chart in FIG. 3.

First, on the surface of the n⁻ type second semiconductor layer 1b with the impurity concentration of abou $5 \times 10^{12}$ to $5 \times 10^{15}/cm^3$, an n type impurity such as arsenic, phosphorus and antimony is diffused to form an n⁺ type first semiconductor layer 1a. The thickness of the second semiconductor layer 1b is about 40 to 200 µm, or preferably 60 to 150 µm. If too thick, $V_{CE}(sat)$ becomes too large, whereas if too thin, high breakdown voltage is not obtained due to punch-through. On the second semiconductor layer 1b an n⁻⁻ type third semiconductor layer 1c of lower impurity concentration about $5 \times 10^{11}$ to $5 \times 10^{14}/cm^3$, is provided by epitaxial growth in about 10 to 50 µm, or preferably 15 to 30 µm (see FIG. 3 (a)).

Next, from the surface of the n⁻⁻ type third semiconductor layer 1c, a p type base layer 2 is formed by ion implantation or diffusion method (FIG. 3 (b)). When forming a field limiting ring, it is formed simultaneously with the base region 2. In the central part of the thin base region 2, an impurity such as phosphorus is injected, and an n⁺ type emitter region 3 is formed.

Consequently, although not shown, and insulation film is provided on the surface of the semiconductor layer, and a contact hole is formed on the insulation film, a base electrode is provided on the upper part of the base region 2, and an emitter electrode from the emitter region 3, and the electrodes are wired to fabricate a transistor.

The example of npn transistor is mentioned above, but the invention is similarly applicable to the pnp transistor of inverted conductive type or MOS type field effect transistor. After further disposing a low resistance layer on the third semiconductor layer 1c, the transistor may be formed.

According to the transistor of this example, since the collector region comprises of a semiconductor layer of such impurity concentration as to be preferable for the transistor operation and specific resistance for theoretical breakdown voltage, and a semiconductor layer of low impurity concentration of high specific resistance provided at the surface side, a high speed switching characteristic is obtained at a low saturation voltage, and the transistor of high breakdown voltage is obtained by the semiconductor layer of low impurity concentration at the surface side.

Moreover, the depletion layer width necessary for achieving breakdown voltage may be narrow, so that the high resistance layer may be made thin, and the base layer may be shallow, and hence the diffusion time can be curtailed.

EXAMPLE 2

The transistor in the multi-emitter structure according to the second aspect of the invention is described below by reference to the accompanying drawings.

Figure 4:
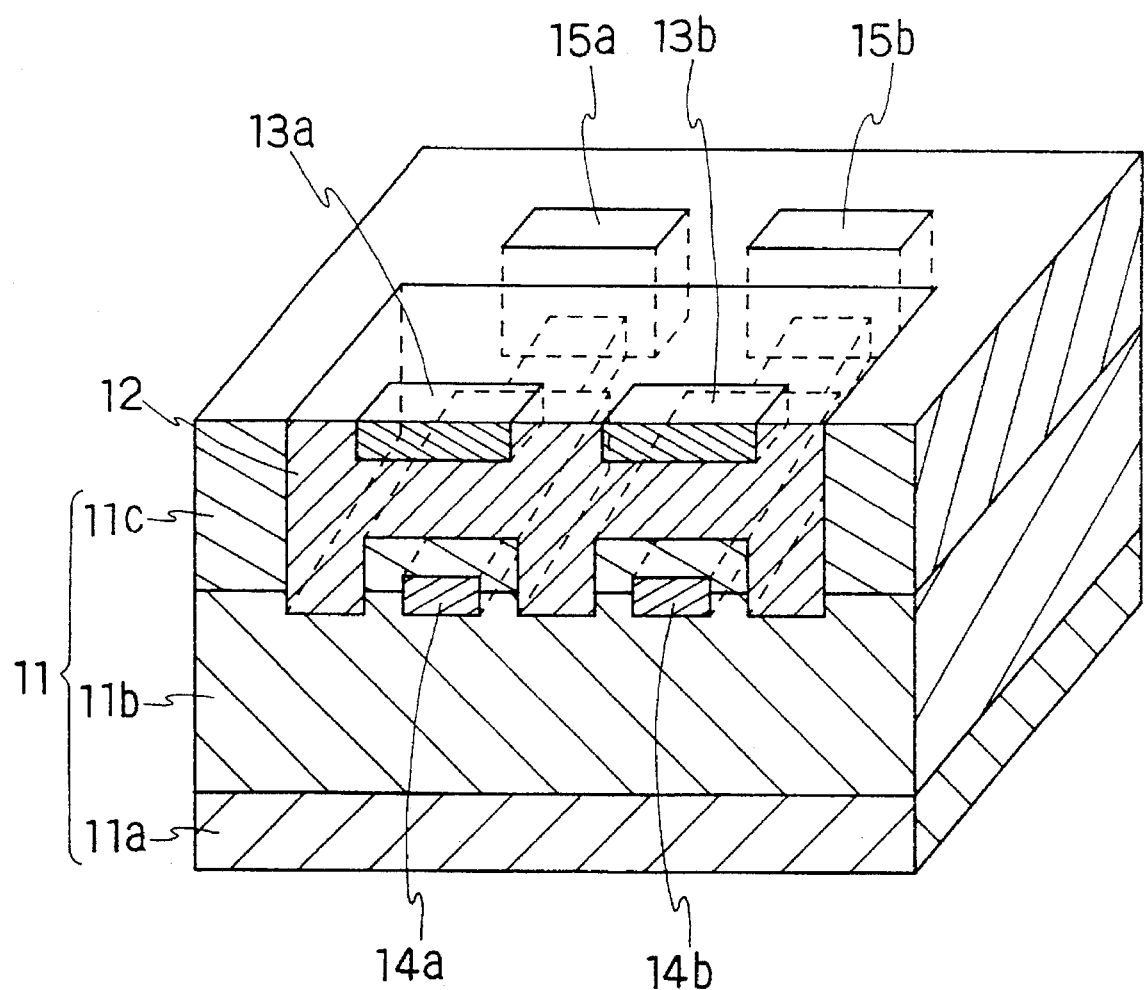
FIG. 4 is a partial sectional perspective view showing the structure of npn type transistor in example 2 of the inention.

In FIG. 4, a multi-emitter transistor comprises of plural unit transistors, comprising a collector region 11 of first conductive type of, for example, n⁻ type epitaxially grown on a semiconductor substrate, a base region 12 of second conductive type of, for example, n type formed by diffusion or the like on the collector region 11, and multi-emitter regions 13 ( 13a, 13b, . . . ) of first conductive type of, for example, n type, formed in a plurality of insular forms by diffusion or the like in the base region 12. Each unit transistor is provided with internal base layers 14 (14a, 14b, . . . ) of second conductive type of, for example, p⁺ type, and the internal base layers 14a . . . arranged in each row are provided consecutively, and diffusion regions 15 (15a, 15b, . . . ) of high concentration impurity conducting with the surface of the semiconductor layer of the same conductive type as the internal base layers 14, for example, p⁺ type are disposed at the end portion. The base region 12 is, as shown in FIG. 4, formed thick in the surrounding of each unit transistor toward the inside of the semiconductor layer, and thin in the central part beneath the emitter region, and the section has "π"-like shape. The internal base layers 14 penetrate through the collector region 11 in the "π"-like shaped recess of the base region 12, and are connected with the p⁺ diffusion regions 15 (15a, 15b, . . . ) communicating with the surface of the semiconductor layer where unit transistors are not formed. They are further connected to the base electrode pads by the wiring provided through the insulating layer (not shown) on the semiconductor surface.

Figure 5A:
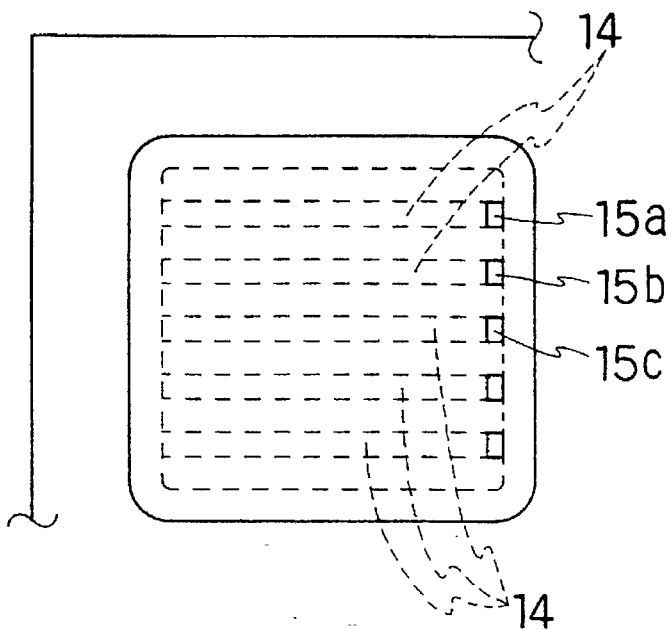
FIGS. 5(a) and 5(b) are schematic plan view showing configuration of internal base layers of the transistor of example 2.
Figure 5B:
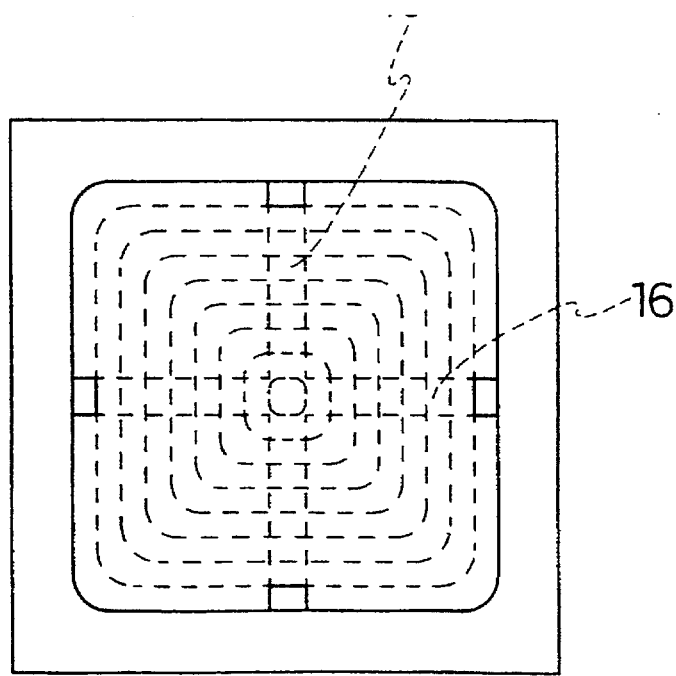

The internal base layers 14 may be also connected directly with the base regions 12 through semiconductor layer, without being once led out onto the substrate surface through the diffusion regions 15. By connecting to the base electrode pads through the diffusion regions 15, the base regions 12 of large resistance can be skipped, so that the residual carrier can be eliminated earlier, but when directly connected to the base regions 12, the chip area can be reduced. If diffusion regions 15 are not provided, it is preferred to form the "π"-sections of the base regions adjacent unit transistors continuously and form also the internal base regions 14 continuously because it is not necessary to connect the internal base layers 14 and base regions 12 in ecah unit transistor. Examples of continuous form of internal base layers 14 are shown in FIG. 5 (a) and (b). FIG. 5(a) shows an example of internal base layers 14 provided continuously to unit transistors arranged in a row, and FIG. 5(a) shows an example of coupling each unit transistor with a square ring. In the case of ring form coupling, as shown in FIGS. 5(b) shows an example of coupling each unit transistor with a square ring. In the case of ring form coupling, as shown in FIG. 5(b), it is preferred to couple each ring further with an impurity layer 16.

Figure 6:
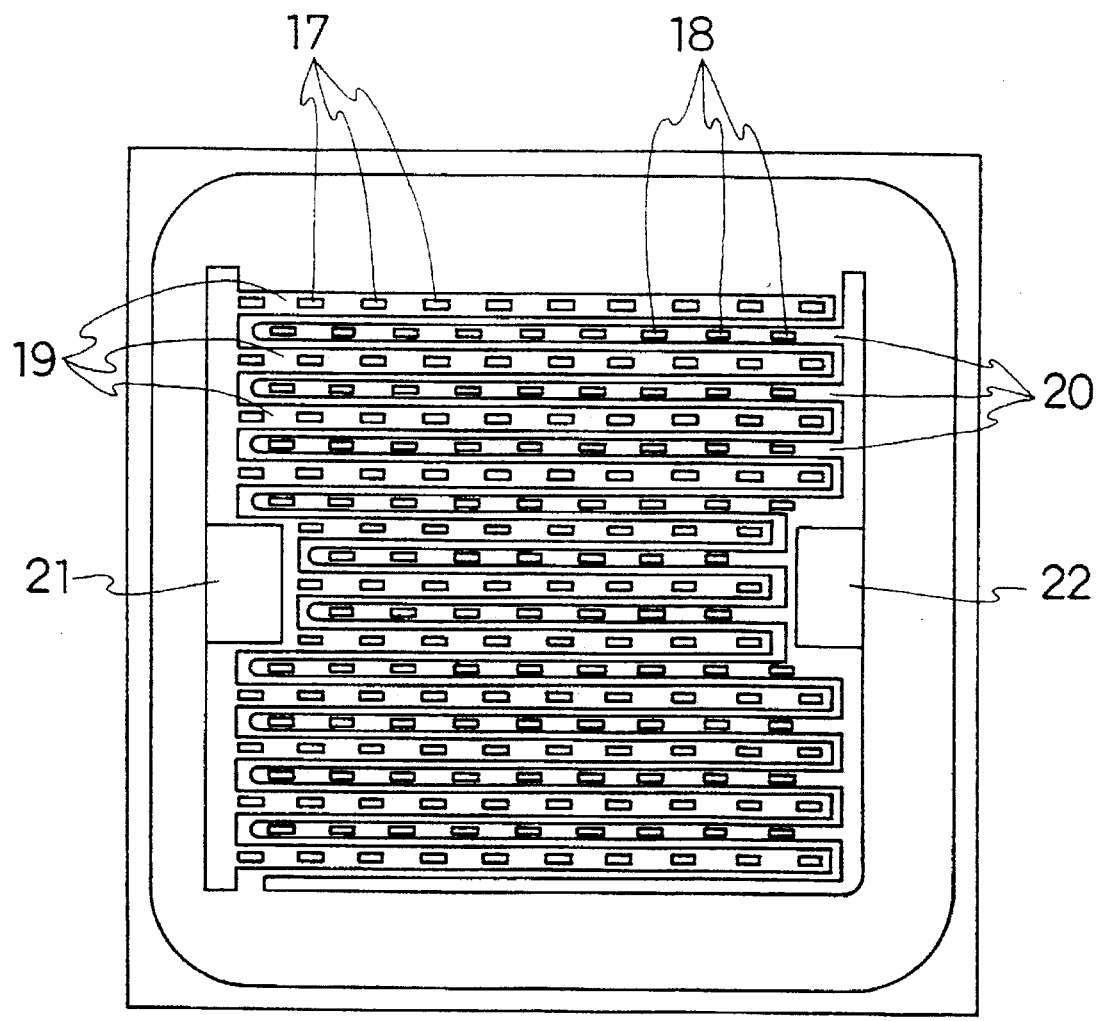
FIG. 6 is a partial plan explanatory diagram showing patterns of base electrode and emitter electrode in an embodiment of multi-emitter transistor in example 2.

A plane explanatory diagram of base electrode and emitter electrode of the multi-emitter transistor is given in FIG. 6, in which base contacts 17 and emitter contacts 18 are provided on the base regions and multi-emitter regions through openings formed in the insulating film, and are further connected respectively to the base electrode wiring 19 and emitter electrode wiring 20, and connected to the base pads 21 and emitter pads 22.

In the multi-emitter transistor of the invention, the layers of the base regions 2 beneath the multi-emitter regions 13 (13a, 13b, ...) which are unit trasistors are formed thin, and internal base layers 14 (14a, 14b, ...) of high impurity concentration are provided in the collector regions 11 at the lower side of thin base resions 2, and the internal base layers 14 are not directly connected to the base regions 12, but are connected with the base electrode pads through the diffusion regions 15 (15a, 15b, ...) of high impurity concentration. Accordingly, the carrier remaining in the collector regions can be easily captured by the internal base layers 14 of low resistance, and escapes to the base electrodes through the diffusion regions 5 of low resistance, so that the residual carrier can be immediately eliminated. A a result, the switching speed is fast, and in particular the turn-off time ($t_{off}$) from saturation sate to cut-off state can be greatly reduced.

The enhancement of the transistor characteristic in the structure of thin thickness $W_B$ of the base region of the invention is further described below.

If the first place, generally, the base ground current amplification factor $h_{FE}$ is expressed as follows:

$$h_{FE} \propto \frac{1}{1 + \frac{\sigma_B}{\sigma_E} \cdot \frac{W_B}{L_h}} \cdot \frac{1}{1 + \frac{1}{2}\left(\frac{W_B}{L_n}\right)^2} \quad (2)$$

where $\sigma_B$, $\sigma_E$ are the conductivities of base and emitter, respectively, $W_B$ is thickness of base region, and $L_h$, $L_n$ are the diffusion lengths of minority carrier of holes and electrons, respectively. Herein, when $W_B$ is smaller, $h_{FE}$ becomes larger, so that a high current amplification factor $h_{FE}$ is obtained.

Furthermore, the transition frequency $f_T$ is expressed as $$f_T \simeq \frac{1}{2\pi} \cdot \frac{2 D_n}{W_B^2}$$

where Dn is the diffusion coefficient. Herein, when $W_B$ is smaller, $f_T$ becomes larger, so that a high $f_T$ is obtained.

On the other hand, the breakdown voltage BV is expressed in the former formula (1)

$$BV \simeq \left(\frac{N_C}{10^{16}}\right)^{-3/4} [\{(n+1+r)r^n\}^{1/(n+1)} - r] \quad (1)$$

where n=1 or 2, $N_C$ is the impurity concentration of collector region, and $r_j$ is the radius of curvature, and $$r \simeq \frac{r_j}{W_B}.$$

When r is infinite, the value in square brackets at the right side of formula (1) nears 1, and hence the breakdown voltage BV is larger when $W_B$ is greater. Besides, the safe operating area is narrow because of secondary breakdown. The secondary breakdown occurs in forward bias when the voltage drop caused by the base current flowing in the lateral direction causes the base current to be concentrated in the end portion of the emitter regions 13. Hence it may break the transistor down. In the invention, by increasing the thickness $W_B$ of the base regions 12 around the end portion of the emitter regions where the current is likely to be concentrated as much as possible, the secondary breakdown is suppressed, and the safe operating area are can be broadened.

That is, in the multi-emitter transistor according to the second aspect of the invention, the thickness $W_B$ of the base regions 12 beneath the multi-emitter regions 13a, 13b, ... is formed thin so as to obtain a high transition freqeucy $f_T$ and high current amplification factor $h_{FE}$, while the thickness of the outside base regions 12 is formed thick, so that a wide safe operating area and a high breakdown voltage are realized.

Moreover, in the invention, internal base layers 14 of high impurity concentration are formed in the collector regions 11 at the lower side of the thin base regions 12, and are connected with the base regions 12, or connected with the base electrodes on the substrate surface, and hence $L_h$ and $L_n$ are small in formula (2), and the amplification factor $h_{FE}$ increases, while the minority residual carrier remaining in the collector regions 11 is easily captured in the internal base layer 14 of low resistance, escapes to the base electrodes through the base regions or wiring, so that the residual carrier may be eliminated immediately. As a result, the switching speed is fast, and especially the turn-off time ($t_{off}$) from saturation state to cut-off state is curtailed.

The fabrication method of the transistor of this example is described according to the process chart in FIG. 7.

Figure 7A:
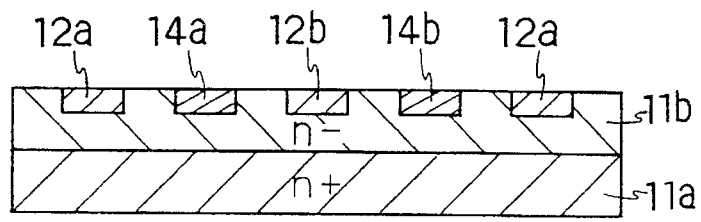
FIGS. 7(a) through 7(d) illustrate sectional explanatory diagrams showing an example of fabrication method of the transistor of example 2.
Figure 7B:
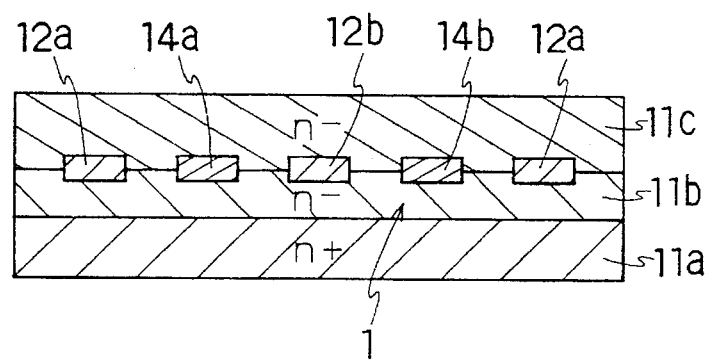

First, on the semiconductor substrate 11a, an n⁻ type epitaxial layer 11b is formed by epitaxial growth to form part of the collector region 11, the base ends 12a, 12b of part of the p type base region 12, and internal base layer 14 are formed in the epitaxial layer 11b by ion implantation, diffusion or other method (see FIG. 7(a)).

Consequently, on the base ends 12a, 12b and forming surface of the internal base layer 14, and n⁻ type epitaxial layer 11c is formed by epitaxial growth, and the collector region 11 is formed (see FIG. 7 (b)). Since the temperature elevates at this time of epitaxial growth, the impurities of the base ends 12a, 12b and internal base layers 14a, 14b diffuse in the growing epitaxial layer 11c, and slightly spread upward.

Afterwards, by introducing a p type impurity from the surface of the epitaxial layer 11c, the base ends connected to the base ends 12a, 12b, the base region 12 between them, and the diffusion region (not shown) connected with the internal layer 14 adjacently to the base region 12 are formed (see FIG. 7 (c)).

Figure 7C:
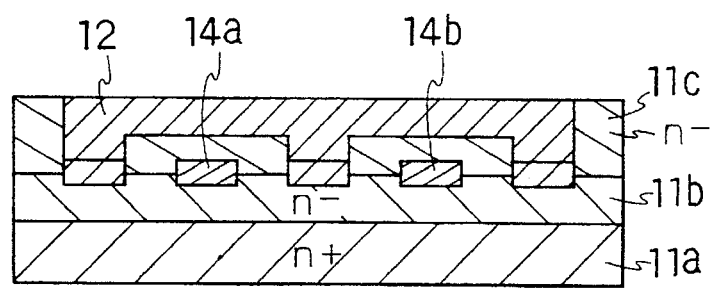

In this base region 12, for example, by the p⁻ type impurity, the upper parts of the base ends 12a, 12b are formed deep so as to be connected with the base ends 12a, 12b at the end portion of the base regions 12, and the intermediate middle parts are formed shallow so as not to connect with the internal base layers 14a, 14b, and thereby a "π"-like shaped section is formed as shown in FIG. 7(c). The shallow portion is a depth of about, for example, 1 to 20 μm, and the deep portion is about 5 to 50 μm. Thus, to form the end portions in a deep impurity region and the intermediate portions in a shallow impurity region, the diffusion process is divided into two steps, and the impurities are introduced separately into the end portion and central portion, or impurities of different diffusion speed are used, for example, aluminium and arsenic, and the aluminium of fast diffusion speed is applied in the end portion while the arsenic of slow diffusion speed in the central portion, diffusing at about 950° C. to 1380° C., and in the same diffusion time, the aluminium of fast diffusion speed diffuses to a greater depth, thereby forming the base region 1 as shown in FIG. 7(c). Or, when feeding the impurity by ion implantation, the depth of the impurity region can be adjusted by controlling the ion implantation energy.

Figure 7D:
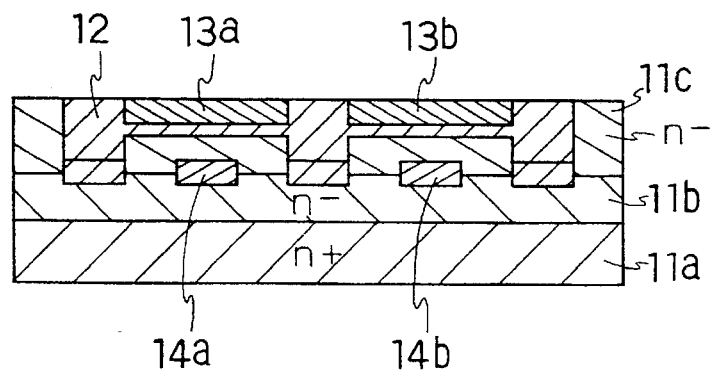
Figure 8:
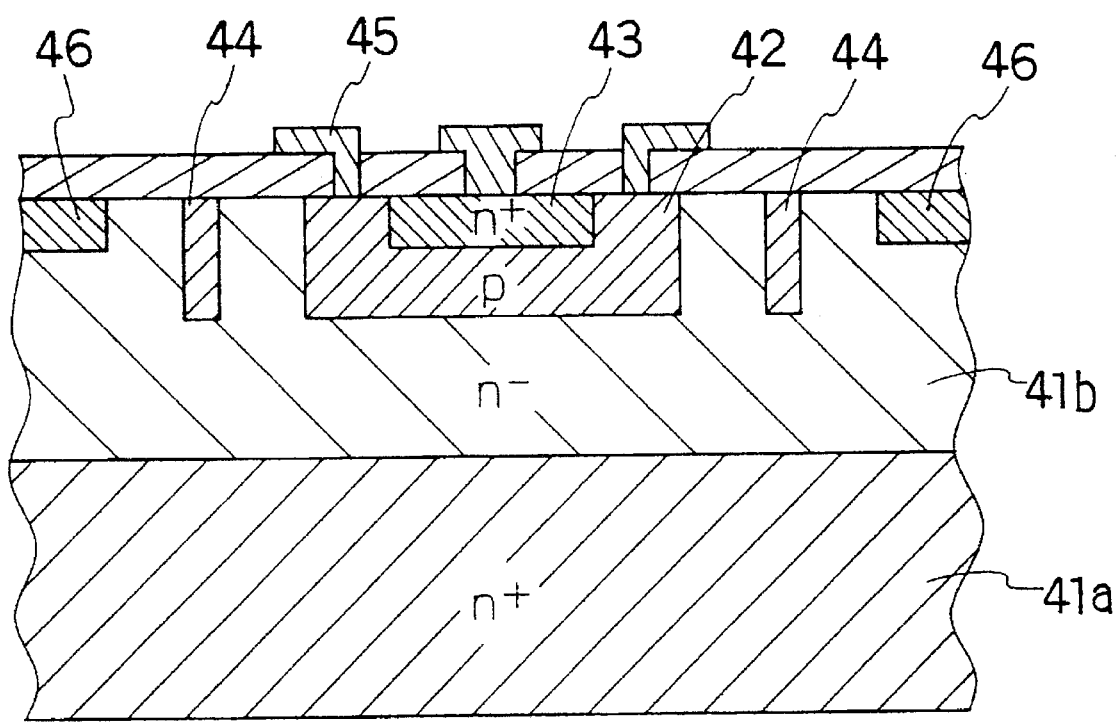
FIG. 8 is a sectional view showing an example of a conventional transistor.
Figure 9:
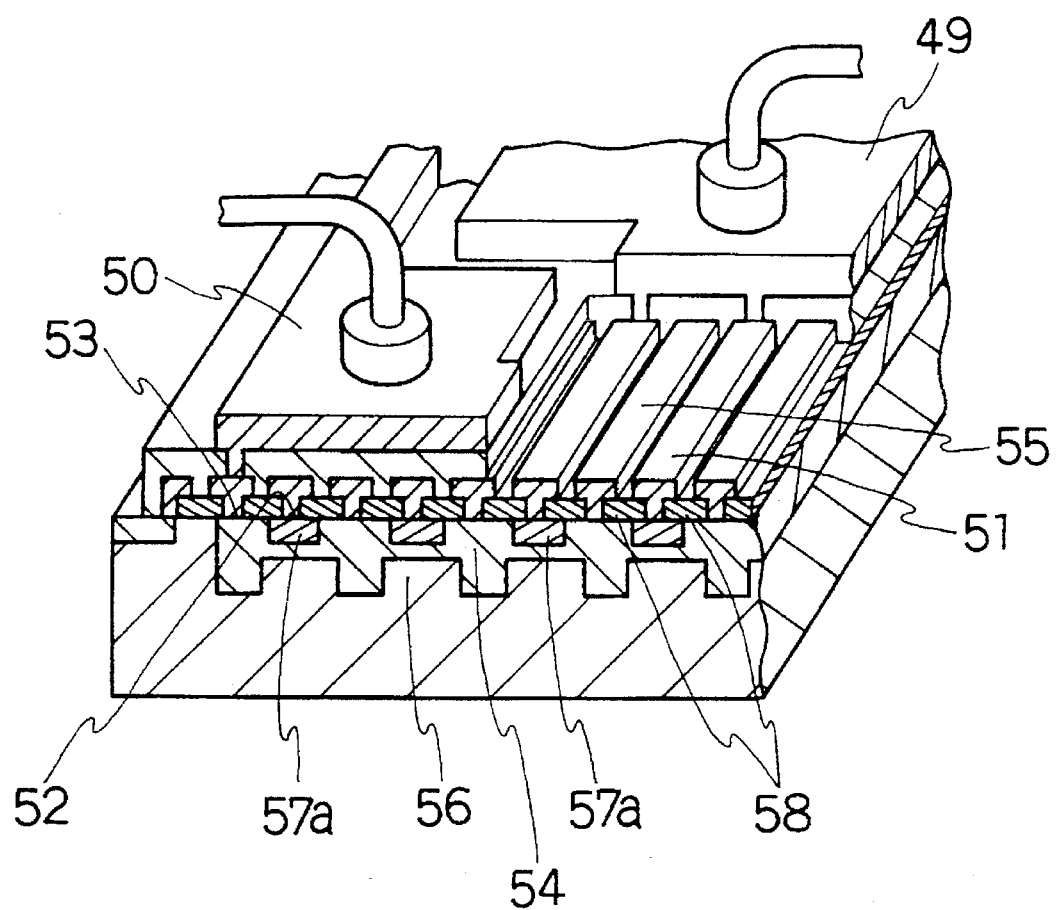
FIG. 9 is a perspective view showing the structure of a conventional multi-emitter transistor.
Figure 10:
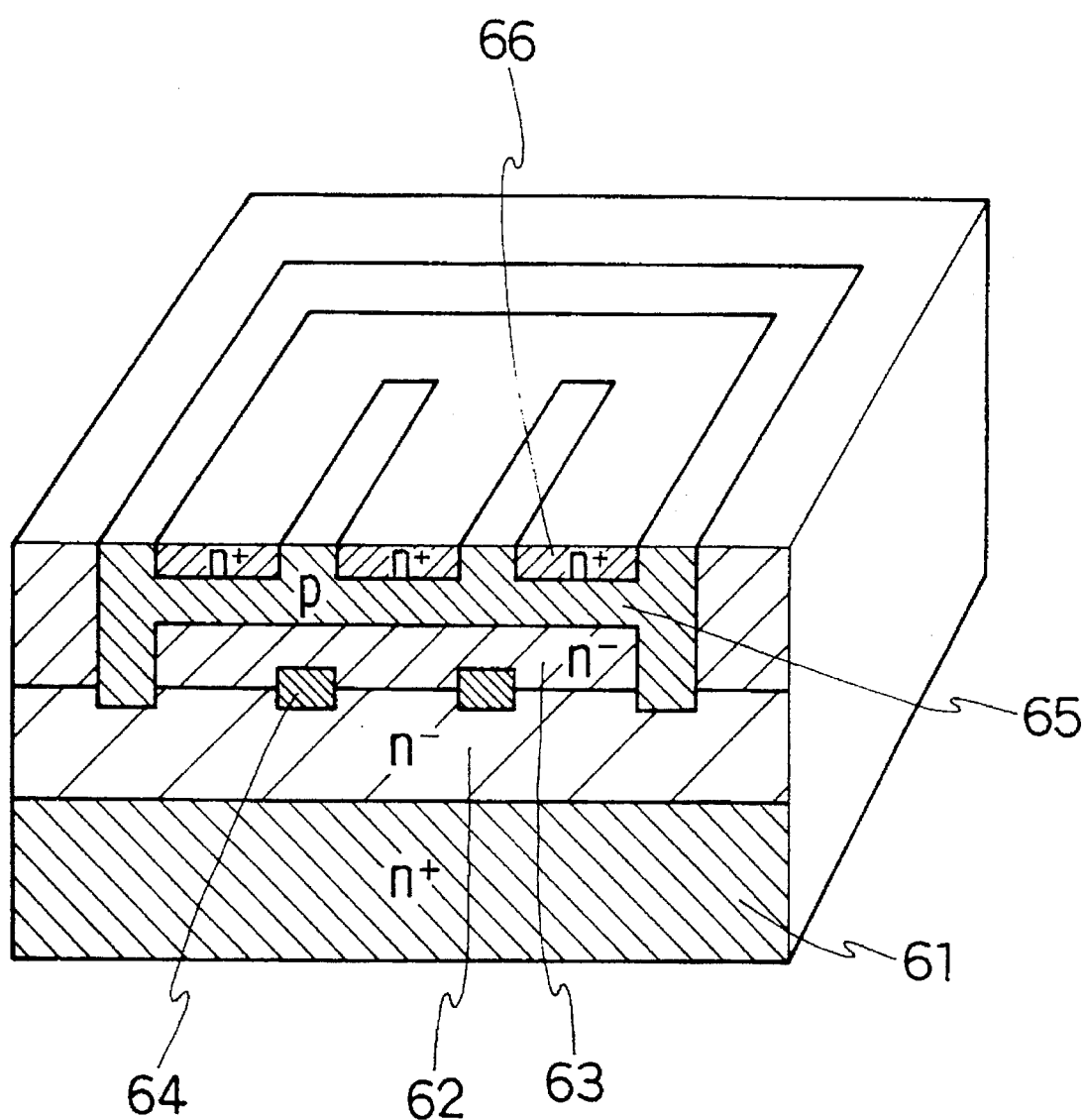
FIG. 10 is a partial sectional perspective view showing a schematic structure of other example of a conventional multi-emitter transistor.

Furthermore, by introducing impurity such as phosphorus in the thinly formed central part of the base region 12, n+ emitter regions 13a, 13b are formed (see FIG. 7(d)). Moreover, although not shown, in the same manner as in the ordinary method, contact holes are formed in the insulation film provided on the surface of the semiconductor layer, electrodes are provided in each region, and the electrodes are wired.

Herein, the example of npn transistor explained in the embodiment, but it is the same with the pnp transistor of inverted conductive type. The shape of the base region and diode is not limited to the explained example. Instead of the illustrated example of the multi-base transistor, it is the same with the multi-emitter transistor. Still more, by combining with embodiment 1, the breakdown voltage may be furhter enhanced.

As explained herein, according to the embodiment, the base regions are formed thin immediately beneath the emitter regions of unit transistors of multi-base transistor of multi-emitter transistor, and internal base layers are formed at the lower side thereof, and hence the current amplification factor $h_{FE}$ and current gain band width product $f_T$ can be enhanced, while the minority carrier implanted into the collector regions flows into the base side through the internal bases in a short time at the time of switching, and is recombined. As a result, the switching operation is fast, and the time to switch from saturation state to cut-off state is cut short. Accordingly, the power consumption of the electric circuit during the switching time is decreased and heat generation is suppressed, so that the transistor amplification, other characteristics, and reliability can be enhanced. In addition, since the base regions around the emitter regions are formed thick, current concentration is prevented, and the safe operating area can be widened.

Though several embodiments of the present invention are described above, it is to be understood that the present invention is not limited only to the above-mentioned, various changes and modifications may be made in the invention without departing from the spirit and scope thereof.

What is claimed is:

1. A transistor comprising:
    (a) a first semiconductor layer formed by a semiconductor substrate;
    (b) a second semiconductor layer formed on the first semiconductor layer and having an impurity of the same conductivity type as said first semiconductor layer in a concentration lower than that of the first semiconductor layer; and
    (c) a third semiconductor layer formed on the second semiconductor layer having an impurity of the same conductivity type as said first semiconductor layer in a concentration lower than that of the second semiconductor layer;
    wherein a base region is formed in the third semiconductor layer and an emitter region is formed in the base region,
    wherein the emitter region or the base region is in a multi-emitter or multi-base structure, formed of a plurality of insular regions, each constituting a unit transistor, and each unit transistor is formed thinner in a thickness of the base region immediately beneath the emitter region than a thickness of the base region in a portion free from the emitter region, and therein section of the base region is formed in a "π"-like shape, and an internal base layer is formed in each "π"-like shape recess,
    wherein the internal base layer is connected to a high concentration impurity region introduced from a surface of the semiconductor substrate, and is connected to a base electrode through wiring.

2. A transistor of claim 1, wherein the impurity concentration of the third semiconductor layer is $5 \times 10^{11}$ to $5 \times 10^{14}$/cm$^3$.

3. A transistor of claim 1, wherein the second semiconductor layer is formed by diffusion into the semiconductor substrate.

4. A transistor of claim 1, wherein the second semiconductor layer is formed by epitaxial growth.

5. A transistor of claim 1, wherein one of a field limiting ring and a field plate is provided around the base region.

6. A transistor of claim 1, wherein the "π"-like shaped section of the base region is continuously formed in at least two adjacent unit transistors, and internal base layer is continuously formed in the recesses of the adjacent transistors.

7. A transistor of claim 1, wherein each internal base layer of each unit transistor is connected to the base region of the unit transistor.

8. A transistor comprising:
    a collector region of first conductive type provided on a semiconductor substrate,
    a base region of second conductive type provided on the collector region, and
    an emitter region of the first conductive type provided on the base region,
    emitter regions or base regions formed in a plurality of insular forms, in a multi-emitter or multi-base structure composed of a plurality of unit transistors, wherein each unit transistor is formed so that a thickness of the base region immediately beneath the emitter region is thinner than a thickness of the base region in a portion free of the emitter region, and the base region is formed in a "π"-like shape section, and an internal base layer is formed in each recess of the "π"-like shape,
    wherein the "π"-like shape section of the base region is continuously formed in at least two adjacent unit transistors, and the internal base layer is continuously formed in the recesses of the adjacent transistors.

9. A transistor of claim 8, wherein each internal base layer of each unit transistor is connected to the base region of the unit transistor.

10. A transistor comprising:
    a collector region of first conductive type provided on a semiconductor substrate,
    a base region of second conductive type provided on the collector region, and
    an emitter region of the first conductive type provided on the base region,
    emitter regions or base regions formed in a plurality of insular forms, in a multi-emitter or multi-base structure composed of a plurality of unit transistors, wherein each unit transistor is formed so that a thickness of the base region immediately beneath the emitter region is thinner than a thickness of the base region in a portion free of the emitter region, and the base region is formed in a "π"-like shape section, and an internal base layer is formed in each recess of the "π"-like shape,
    wherein the internal base layer is connected to a high concentration impurity region introduced from a surface of the semiconductor substrate, and is connected to a base electrode through wiring.

* * * * *